United States Patent
Jung et al.

(10) Patent No.: US 9,935,153 B1
(45) Date of Patent: Apr. 3, 2018

(54) LIGHT EMITTING DIODE PANEL AND MANUFACTURING METHOD THEREOF

(71) Applicant: SAMSUNG ELECTRONICS CO., LTD., Suwon-si (KR)

(72) Inventors: Jong-hoon Jung, Suwon-si (KR); Dae-sik Kim, Suwon-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 15/480,864

(22) Filed: Apr. 6, 2017

(30) Foreign Application Priority Data

Nov. 7, 2016 (KR) .................. 10-2016-0147756

(51) Int. Cl.
| | |
|---|---|
| *H01L 33/36* | (2010.01) |
| *H01L 27/15* | (2006.01) |
| *H01L 33/62* | (2010.01) |
| *H01L 33/50* | (2010.01) |
| *H01L 33/48* | (2010.01) |
| *G02B 5/20* | (2006.01) |
| *H01L 27/32* | (2006.01) |

(52) U.S. Cl.
CPC ............ *H01L 27/156* (2013.01); *G02B 5/201* (2013.01); *H01L 33/483* (2013.01); *H01L 33/502* (2013.01); *H01L 33/507* (2013.01); *H01L 33/62* (2013.01); *H01L 27/322* (2013.01); *H01L 27/326* (2013.01); *H01L 27/3211* (2013.01); *H01L 27/3218* (2013.01); *H01L 33/36* (2013.01); *H01L 2933/0066* (2013.01); *H01L 2933/0083* (2013.01)

(58) Field of Classification Search
CPC ............... H01L 27/3218; H01L 27/322; H01L 27/3211; H01L 27/326; H01L 33/36

USPC ............................................... 257/89; 438/35
See application file for complete search history.

(56) References Cited

U.S. PATENT DOCUMENTS

| | | | |
|---|---|---|---|
| 8,791,474 B1 | 7/2014 | Bibl et al. | |
| 9,202,996 B2 | 12/2015 | Orsley et al. | |
| 2007/0007528 A1 | 1/2007 | Tsujimura et al. | |
| 2009/0322215 A1* | 12/2009 | Sung .................. | H01L 27/3211 313/504 |
| 2010/0072478 A1 | 3/2010 | Koo et al. | |

(Continued)

FOREIGN PATENT DOCUMENTS

| | | |
|---|---|---|
| KR | 1020120038626 A | 4/2012 |
| WO | 2015194870 A1 | 12/2015 |

OTHER PUBLICATIONS

International Search Report, issued by International Searching Authority in International Application No. PCT/KR2017/009867, dated Nov. 29, 2017, (PCT/ISA/210).

(Continued)

*Primary Examiner* — George Fourson, III
(74) *Attorney, Agent, or Firm* — Sughrue Mion, PLLC

(57) ABSTRACT

A light emitting diode (LED) panel and a manufacturing method thereof are provided. The LED panel includes: a substrate; and a plurality of subpixel areas formed over a substrate, in which each of the plurality of subpixel areas include: a plurality of pixel electrodes spaced from each other; at least LED formed over the plurality of pixel electrodes; and at least one transistor disposed at one side of at least one of the plurality of pixel electrodes to control at least one of the plurality of pixel electrodes.

20 Claims, 30 Drawing Sheets

(56) References Cited

U.S. PATENT DOCUMENTS

| | | |
|---|---|---|
| 2011/0241036 A1* | 10/2011 | Yoshinaga .......... H01L 27/3276 257/89 |
| 2012/0293399 A1* | 11/2012 | Haskin .............. G02F 1/134309 345/88 |
| 2014/0124802 A1 | 5/2014 | Do et al. |
| 2015/0137163 A1 | 5/2015 | Harris |
| 2016/0013170 A1 | 1/2016 | Sakariya et al. |
| 2016/0211245 A1 | 7/2016 | Do |
| 2016/0240632 A1* | 8/2016 | Satoh ....................... H01L 29/41 |
| 2016/0247441 A1* | 8/2016 | Matsueda ............ G09G 3/2003 |
| 2017/0092627 A1* | 3/2017 | Hu ....................... H01L 25/0753 |
| 2017/0133627 A1* | 5/2017 | Sato .................... H01L 51/5246 |
| 2017/0139263 A1* | 5/2017 | Jin ..................... G02F 1/133512 |
| 2017/0149006 A1* | 5/2017 | Park .................... H01L 51/5072 |
| 2017/0154919 A1* | 6/2017 | Chen ...................... H01L 27/124 |
| 2017/0179092 A1* | 6/2017 | Sasaki ................... H01L 25/167 |
| 2017/0179438 A1* | 6/2017 | Xu ....................... H01L 51/5281 |

OTHER PUBLICATIONS

Written Opinion, issued by International Searching Authority in International Application No. PCT/KR2017/009867, dated Nov. 29, 2017, (PCT/ISA/237).

\* cited by examiner

LIGHT EMITTING DIODE PANEL AND MANUFACTURING METHOD THEREOF

CROSS-REFERENCE TO RELATED APPLICATIONS

This application claims priority from Korean Patent Application No. 10-2016-0147756, filed on Nov. 7, 2016 in the Korean Intellectual Property Office the disclosure of which is incorporated herein by reference in its entirety.

BACKGROUND

Field

Apparatuses and methods consistent with the present disclosure relate to a display panel and a manufacturing method thereof, and more particularly, to an LED display panel using a light emitting diode and a manufacturing method thereof.

Description of the Related Art

In related art display devices using light emitting diodes (LEDs), three LEDs consisting of red (R), green (G) and blue (B), respectively, are used to constitute one pixel. The three LEDs are each manufactured in different ways, and therefore, the three LEDs need to be separately manufactured and combined into one. As a result, the number of operations related to the manufacturing process is increased, and a large number of color deviations occur due to temperature and environment.

In addition, the red and green LEDs are manufactured in combination with a glass package including a blue LED and a quantum dot corresponding to each of the red and green LEDs. In other words, the red and green LEDs are manufactured by a method for covering the quantum dot and the glass thereon and sealing the structure, and the quantum dot converts a wavelength of blue light emitted from the bottom to represent red and green colors, respectively. At this point, the LED is bonded on the substrate, connected to an electrode by a gold wire, and has a shape in which the periphery thereof is enclosed with a plastic mold.

The manufacturing process includes separating the LEDs manufactured in an array on one wafer one by one to bond the LEDs on a PCB connected with a structure enclosed with the plastic mold one by one, connecting each of the positive (+) and negative (−) electrodes to a pad by the gold wire, and bonding a glass package including the quantum dot thereon.

However, when the quantum dot is bonded on the LED, the quantum dot, which is vulnerable to heat, deteriorates and thus light conversion characteristics are rapidly degraded. In addition, there is a problem in that because the processes of manufacturing, separating, and packaging, etc., LEDs on each wafer are required, the process is complicated and material cost is increased.

SUMMARY

One or more exemplary embodiments may overcome the above described disadvantages and other disadvantages not described above. Also, the one or more exemplary embodiments are not required to overcome the disadvantages described above, and may not overcome any of the problems described above.

One or more exemplary embodiments provide an LED panel having an improved manufacturing process by removing an LED mounting process, a manufacturing method thereof, and a driving method.

According to an aspect of exemplary embodiment, an LED panel includes: a substrate; and a plurality of subpixel areas formed over a substrate, wherein each of include: a plurality of pixel electrodes spaced from each other; at least one LED formed over the plurality of pixel electrodes; and at least one transistor disposed at one side of at least one of the plurality of pixel electrodes to control at least one of the plurality of pixel electrodes.

The at least one transistor may be disposed on the same plane as the plurality of pixel electrodes or may be disposed below r the plurality of pixel electrodes.

The at least one LED may include a blue LED, and the plurality of subpixel areas may each further include: a light conversion layer formed over the at least one LED and spaced apart from the at least one LED; and a glass layer supporting the light conversion layer.

The light conversion layer may include at least one of a quantum dot and a phosphor.

The LED panel may further include: a cover layer formed over the transistor and covering an area corresponding to the transistor while being spaced apart from the transistor, and the glass layer may support the light conversion layer and the cover layer.

The LED panel may further include: a color filter layer laminated over the light conversion layer having a dimension corresponding to the light conversion layer.

The at least one LED includes a blue LED and the plurality of subpixel areas each may further include a light conversion material coated on the plurality of pixel electrodes.

The LED panel may further include a cover layer laminated over the transistor.

Each of the plurality of subpixel areas may further include the block matrix layer laminated under the substrate.

The at least one LED may include a red LED, a green LED, and a blue LED, and the plurality of subpixel areas may each further include: a cover layer formed over the transistor and covering an area corresponding to the transistor while being spaced apart from the transistor; and a glass layer supporting the cover layer.

The at least one LED may include a red LED, a green LED, and a blue LED and the plurality of subpixel areas each may further include a cover layer over the transistor.

Each of the plurality of pixel electrodes may be spaced at a predetermined interval, where the predetermined interval is may be an interval shorter than a length of a long side of the at least one LED and longer than a length of one polarity of the at least one LED.

The light emitting diode may include: a plurality of nano LEDs, and the plurality of nano LEDs may be aligned in a longitudinal direction so that different polarities thereof contact the plurality of pixel electrodes, respectively.

The at least one LED may include a transparent capsule form including a plurality of nano LEDs therein.

The plurality of nano LEDs included in the transparent capsule may be attached with a metallic material in a longitudinal direction.

The plurality of nano LEDs included in the transparent capsule may be short-circuited by the metallic material and the plurality of electrodes may emit light as an electromotive force is generated by an electric field generated depending on application of voltage.

The plurality of nano LEDs included in the transparent capsule may have brightness adjusted on the basis of at least one of a frequency and a pulse width of a pulse width modulation (PWM) signal applied to the plurality of pixel electrodes.

According to an aspect of another exemplary embodiment, a method for manufacturing an LED panel includes: forming a thin film transistor (TFT) substrate (or TFT panel); dividing the TFT substrate of the TFT panel into a plurality of subpixel areas by a TFT process; forming a plurality of pixel electrodes spaced apart from each other in the plurality of subpixel regions; and laminating at least LED over the plurality of pixel electrodes, in which at least one of the plurality of pixel electrodes may be formed to be connected to at least one TFT included in the subpixel area.

The laminating the at least one LED may include: coating a plurality of nano LEDs on the plurality of pixel electrodes; aligning the plurality of nano LEDs in a longitudinal direction by applying a voltage to the plurality of pixel electrodes; and attaching the plurality of aligned nano LEDs using a metallic material so that different polarities of each of the plurality of nano LEDs contact the plurality of pixel electrodes.

The laminating the at least one LED may include: attaching a transparent capsule including the plurality of nano LEDs therein to the plurality of pixel electrodes.

The plurality of nano LEDs included in the transparent capsule may be attached with a metallic material in a longitudinal direction.

Each of the plurality of pixel electrodes may be spaced at a predetermined interval, where predetermined interval is may be an interval shorter than a length of a long side of the at least one LED and longer than a length of one polarity of the at least one LED.

According to one or more exemplary embodiments, it may be possible to lower the product manufacturing cost by reducing the process complexity occurring in the related art LED package process and removing the LED mounting process.

In addition, it may be possible to improve the efficiency of a related art LCD/OLED processes, by providing the method for manufacturing an LED panel.

BRIEF DESCRIPTION OF THE DRAWINGS

The above and/or other aspects will be more apparent and more readily appreciated from the following description of exemplary embodiments with reference to the accompanying drawings, in which.

DETAILED DESCRIPTION OF EXEMPLARY EMBODIMENTS

Figure 1A:
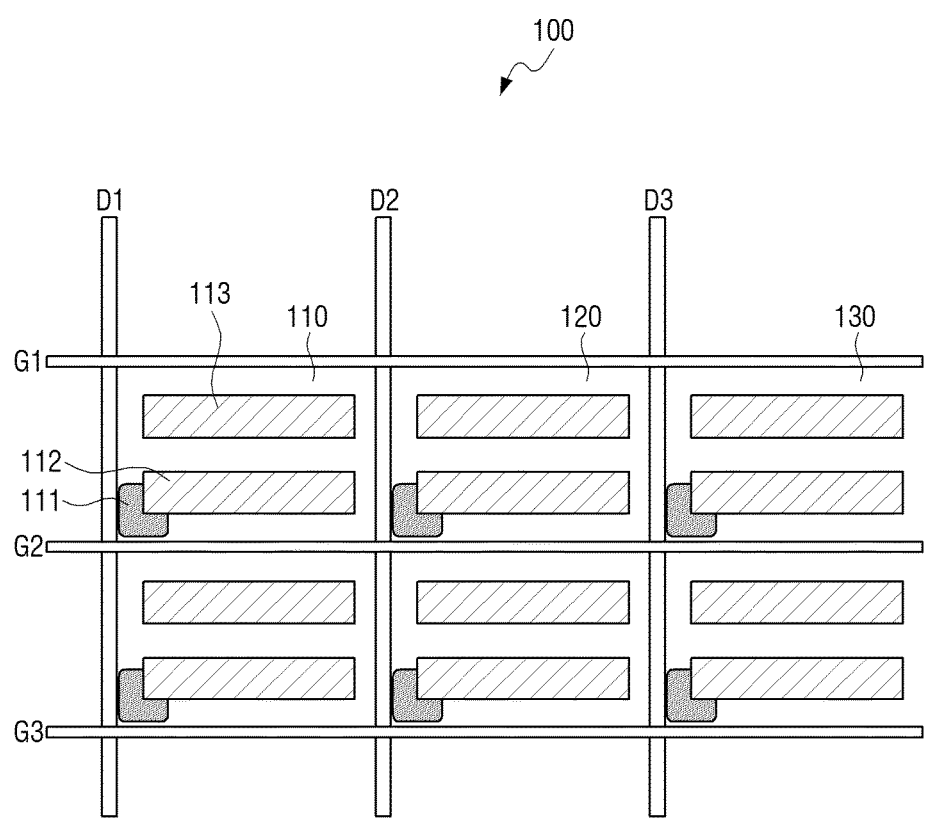
FIGS. 1A and 1B are diagrams illustrating a pixel structure of an LED panel according to an exemplary embodiment.

Hereinafter, various exemplary embodiments will be described with reference to the accompanying drawings. It is to be understood that the content described in the present disclosure should be considered as descriptive and not for the purpose of limitation, and therefore various modifications, equivalents, and/or alternatives of the exemplary embodiments are included in the present disclosure. With reference to descriptions of the accompanying drawings, the same or similar components may be denoted by similar reference numerals.

Further, it is to be understood that in the present disclosure, operatively or communicatively coupling or connecting of one component (e.g., first component) to another component (e.g., second component) may include the case where the respective components are directly connected to each other or indirectly connected to each other through another component (e.g., third component). On the other hand, it may be understood that when any component (e.g., first component) is "directly connected" or "directly coupled" to another component (e.g., second component), there is no another component (e.g., third component) between any component and another component.

The terminologies used in this disclosure should be considered as descriptive and not for the purpose of limiting the scope of exemplary embodiments. Further, although the singular representation may be used in the disclosure for convenience of explanation, it may be interpreted as including plural representations unless the context clearly indicates otherwise. Further, terms used in the disclosure may have the same meaning as commonly understood by those skilled in the art Terms defined in a general dictionary among terms used herein can be interpreted as having the same or similar meaning as the contextual meanings of the related art and unless explicitly defined herein, are not interpreted as an ideal or excessively formal meaning. In some cases, the terms defined herein may not be construed to exclude exemplary embodiments.

Figure 1B:
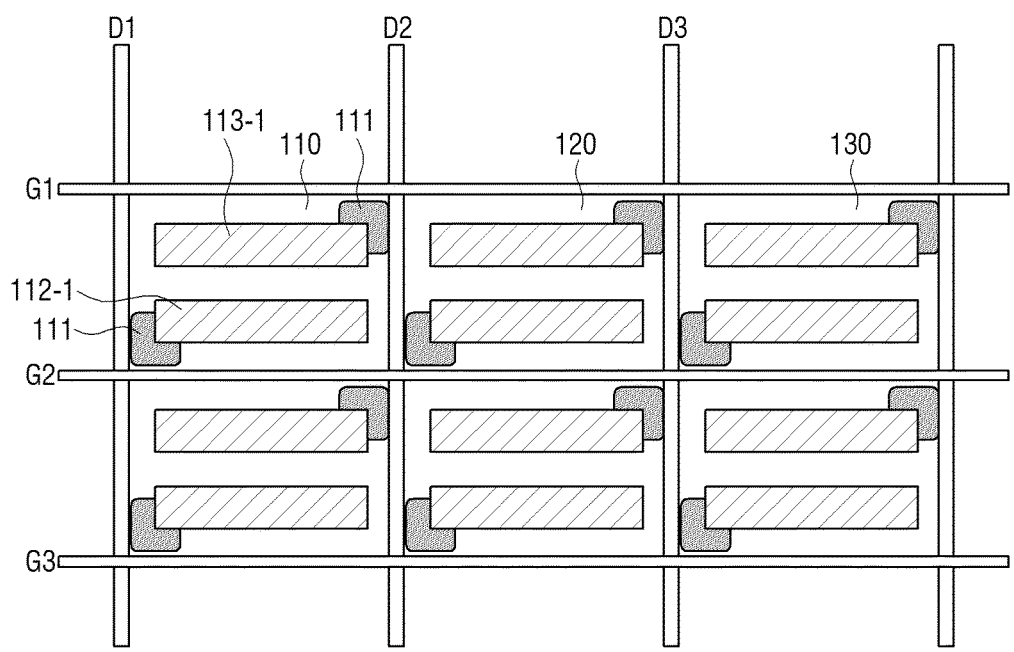

FIGS. 1A and 1B are diagrams illustrating a pixel structure of an LED panel according to an exemplary embodiment.

As illustrated in FIGS. 1A and 1B, according to an exemplary embodiment, an LED panel 100 may have a structure in which a plurality of pixel areas 110, 120 and 130, defined by gate lines G1, G2, G3, ... and data lines D1, D2, D3 . . . , are arranged in a checkered pattern. Here, the plurality of pixel areas 110, 120 and 130 may each be R or G or B subpixel areas.

Each of the pixel areas 110, 120 and 130 may include at least one transistor 111 and a plurality of pixel electrodes 112 and 113 as in FIG. 1A (or 112-1 and 113-1 as in FIG. 1B). In this case, at least one transistor 111 and the plurality of pixel electrodes 112 and 113 (or 112-1 and 113-1) may be formed on the same plane as illustrated. However, according to another exemplary embodiment, transistors 111 may be formed below the plurality of pixel electrodes 112 and 113 (or 112-1 and 113-1), in a planar view.

Light emitting diodes (LEDs) are placed on the plurality of pixel electrodes 112 and 113 (or 112-1 and 113-1) to form pixels, and power is supplied to at least one of the plurality of pixel electrodes 112, and 113 (or 112-1 and 113-1) so that the LEDs emit light.

Here, the plurality of pixel electrodes 112 and 113 (or 112-1 and 113-1) may include one power supply electrode and one common electrode, or may include two power supply electrodes.

For example, FIG. 1A illustrates a case where the plurality of pixel electrodes 112 and 113 are implemented as the power supply electrode 112 and the common electrode 113 and one transistor 111 is provided only on the power supply electrode 112 side.

As another example, FIG. 1B illustrates a case in which the plurality of pixel electrodes 112-1 and 113-1 are implemented as two power supply electrodes and two transistors 111 may be provided at each of two power supply electrodes 112-1 and 113-1 sides.

An interval between the plurality of pixel electrodes 112 and 113 (or 112-1 and 113-1) is related to a length of the LED to be placed on the pixel electrodes. For example, the longer the LED, the wider the gap. That is, the interval between the plurality of pixel electrodes 112 and 113 (or 112-1 and 113-1) may be shorter than a length of a longer side of the light emitting diode, and may be longer than a length of one polarity of the light emitting diode.

For example, the LED according to an exemplary embodiment may be implemented as a nano rods LED having a nano rod structure and the nano rods LED may be placed to connect between the plurality of pixel electrodes 112 and 113 (or 112-1 and 113-1) in a longitudinal direction. Therefore, the interval between the plurality of pixel electrodes 112 and 113 (or 112-1 and 113-1) may be implemented to be shorter than that of the nano rods LED. In addition, each polarity, that is, a p-type portion and an n-type portion of the nano rods LED may be placed in the plurality of pixel electrodes 112 and 113 (or 112-1 and 113-1), respectively. Therefore, the interval between the plurality of pixel electrodes 112 and 113 (or 112-1 and 113-1) may be implemented to be longer than a length of one polarity of the LED.

The transistors 111 may be provided in each of the pixel areas and is a semiconductor element that may serve as a switch for controlling each pixel For example, the transistor 111 serves to adjust a supply time, a supply interval, and a potential difference when supplying power to the LED.

Figure 2:
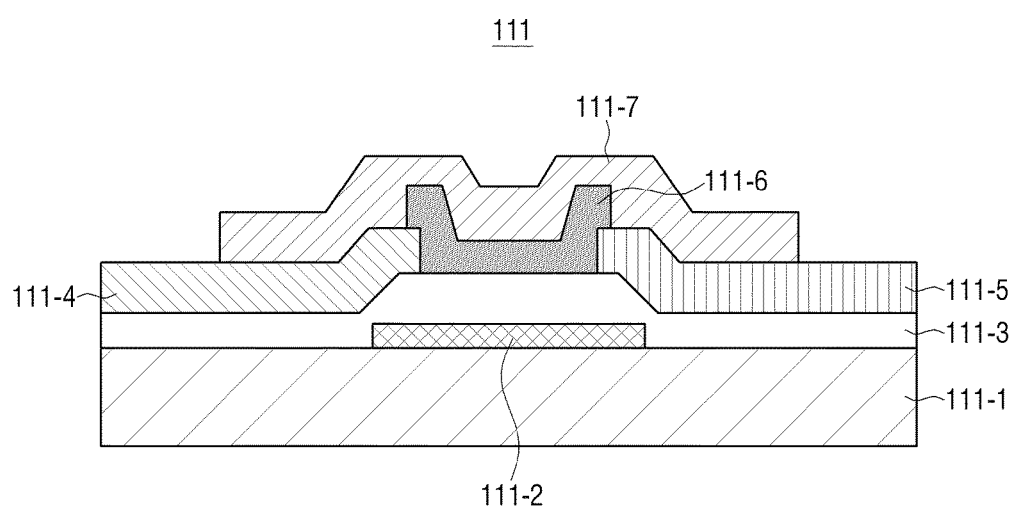
FIG. 2 is a diagram illustrating a TFT structure according to an exemplary embodiment.

The transistor 111 may be implemented as a thin film transistor (TFT) manufactured by the TFT process described below. The TFT has a structure in which an electrode serving as the transistor is made in a very thin rod form, for example, a structure as illustrated in FIG. 2.

A gate electrode 111-2 formed on a substrate 111-1 (for example, glass, polyimide) serves to control a current of an active layer 111-6 to flow or not to flow and a gate insulating film 111-3 serves to separate the gate electrode 111-2 and the active layer 111-6.

Further, a source electrode 111-4 and a drain electrode 111-5 serve as a data electrode that serves to supply and receive electron.

A protective film 111-7 serves to prevent damage caused by scratches or moisture penetration that occurs during substrate movement in the manufacturing process.

The TFT substrate (or TFT array substrate or TFT panel) may be made by a TFT process including forming the gate electrode on a substrate (for example, glass), forming an insulating film and a semiconductor film on the gate electrode, forming the data electrode, and forming the protective film. Here, the TFT may be made of at least one material of amorphous silicon (a-Si), low temperature poly silicon (LTPS), and oxide.

The plurality of pixel electrodes 112 and 113 or 112-1 and 113-1 may be formed together on the TFT process. For example, the pixel electrodes 112 and 113 or 112-1 and 113-1 may be formed to be laminated (or deposited) on the protective film 111-7 after the protective film 111-7 is formed.

However, FIG. 2 illustrates, by way of example, the TFT having an inverted staggered structure, but the exemplary embodiment is not limited thereto. As another example, the TFT having a staggered structure, a coplanar structure, an inverted coplanar structure, or the like may also be used.

Figure 3:
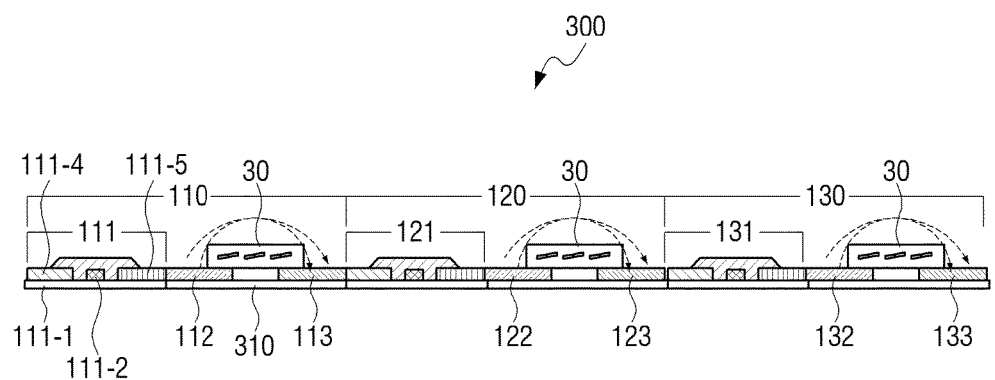
FIG. 3 is a block diagram illustrating a structure of the LED panel according to the exemplary embodiment.

FIG. 3 is a block diagram illustrating a structure of the LED panel according to the exemplary embodiment.

Referring to FIG. 3, according to an exemplary embodiment, one pixel area 300 of the LED panel may include a substrate 310 and a plurality of subpixel areas 110, 120, and 130 formed on the substrate 310. Here, the substrate 310 may be the substrate 111-1 included in the TFT substrate (or the TFT panel) of FIG. 2, but may be implemented as a separate additional substrate. The substrate 310 may be made of glass, polyimide, PET, or the like. Hereinafter, according to an exemplary embodiment, it is assumed that the substrate 310 is implemented as the substrate 111-1 included in a TFT substrate (or a TFT panel).

Each of the subpixel areas 110, 120 and 130 may include the plurality of pixel electrodes 112, 113, 122, 123, 132 and 133 spaced at predetermined intervals, light emitting diodes 30 formed on the plurality of pixel electrode, and at least one transistor 111, 121, 131 disposed at at least one side of the plurality of pixel electrodes.

For example, a first subpixel area 110 may include the plurality of pixel electrodes 112 and 113 spaced at predetermined intervals, the light emitting diodes 30 formed to connect between the plurality of pixel electrodes 112 and 113 at upper ends of the plurality of pixel electrodes 112 and 113, and the transistor 111 disposed at one side of the plurality of pixel electrodes 112 and 113.

Further, a second subpixel area 120 includes the plurality of pixel electrodes 122 and 123 spaced apart from each other at predetermined intervals, the light emitting diodes 30 formed to connect between the plurality of pixel electrodes 122 and 123 at upper ends of the plurality of pixel electrodes 122 and 123, and the transistor 121 disposed at one side of one 122 of the plurality of pixel electrodes 122 and 123.

Further, a third subpixel area 130 includes the plurality of pixel electrodes 132 and 133 spaced apart from each other at predetermined intervals, the light emitting diodes 30 formed to connect between the plurality of pixel electrodes 132 and 133 at upper ends of the plurality of pixel electrodes 132 and 133, and the transistor 131 disposed at one side of one 132 of the plurality of pixel electrodes 132 and 123.

According to one exemplary embodiment, the first to third subpixel areas 110, 120, and 130 may each correspond to R, G, and B subpixels. However, it is also possible to use the structure of FIG. 3 as a monochrome illumination panel without using a light conversion material or the like to be described below.

FIGS. 4A to 4E are diagrams illustrating a structure of an LED panel according to various exemplary embodiment.

Figure 4A:
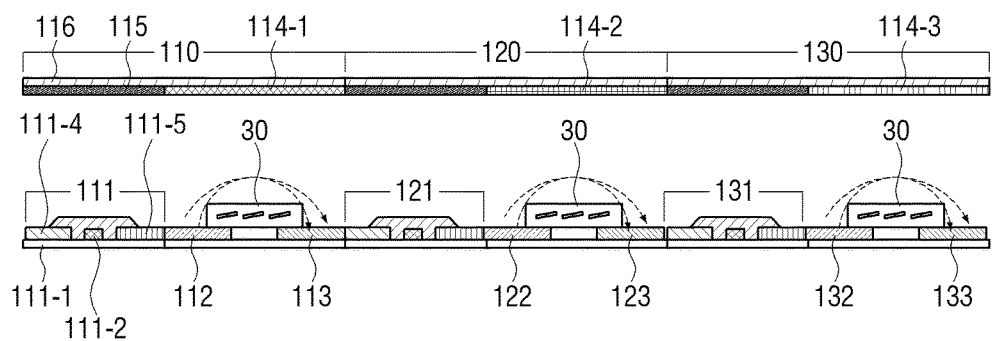
FIGS. 4A to 4E are diagrams illustrating a structure of an LED panel according to various exemplary embodiment.

In the structure of the LED panel illustrated in FIG. 4A, the LED 30 disposed in each of the subpixel areas 110, 120, and 130 in the structure of FIG. 3 may be implemented as the same type of LED emitting the same color.

For example, the LEDs 30 disposed in each of the subpixel areas 110, 120, and 130 may be implemented as a blue LED. When the blue LED passes through the light conversion material, colors visible to human eyes are changed depending on characteristics of the light conversion material. The exemplary embodiment illustrated in FIG. 4A uses this principle, and as such, light conversion layers 114-1, 114-2, and 114-3 corresponding to each of the subpixels, that is, R, G, and B subpixels may be provided over the LED 30.

For example, the light conversion layers 114-1, 114-2, and 114-3 may be formed to correspond to the LED light emitting areas while being spaced apart from the light emitting diodes 30 over the light emitting diodes 30. For example, the light conversion layers 114-1, 114-2, and 114-3 may be formed to correspond to the plurality of pixel electrodes 112 and 113 provided in each of the pixel areas 110, 120, and 130. However, the light conversion layers 114-1, 114-2, and 114-3 are not necessarily formed to correspond to the plurality of pixel electrodes 112 and 113, and may be formed within a threshold range covering the LED light emitting area.

In this case, a spacer may be used to maintain spacing, and as a material of the spacer, silica or dye granules may be used.

The light conversion layers 114-1, 114-2, and 114-3 may be light emitting material that absorb energy to serve to emit specific light, for example, red, green, and blue light. For example, the light conversion layers 114-1, 114-2, and 114-3 may be implemented as a phosphor, a quantum dot, or the like.

According to one exemplary embodiment, when the light conversion layers 114-1, 114-2, and 114-3 are implemented as the quantum dot, if the blue LED passes through a nano sheet implemented as the quantum dot, colors will appear different to human eyes depending on the size of the quantum dot. The quantum dot has characteristics of light of a shorter wavelength (blue color) as a particle size is getting smaller and smaller and light of a longer wavelength (red color) as a particle size is getting larger and larger. By using this, it is possible to implement colors of a red LED and a green LED only by the blue LED. The quantum dot is a nano material, which may include a core and a shell with a size of about 2 to 10 nm. The core may be made of cadmium selenide (CdSe), cadmium telluride (CdTe), cadmium sulfide (CdS), non-cadmium-based metal, or the like, and the shell may be made of zinc sulfide (ZnS), or the like.

According to another exemplary embodiment, when the light conversion layers 114-1, 114-2, and 114-3 are implemented as the phosphor, they may be implemented as phosphors having different colors corresponding to the respective subpixels.

A black matrix layer (black mask layer) 115 may be formed over the transistor 111. The black matrix layer 115 may be formed to correspond to the transistor 111 while being spaced apart from the transistor 111, like the light conversion layer 114. However, the black matrix layer 115 is not necessarily formed so as to exactly correspond to the transistor 111. For example, the black matrix layer 115 may be formed within an appropriate threshold range in which the transistor 111 is covered but the LED light emitting area is not covered.

Here, the black matrix layer 115 may serve as a light shield layer formed between the respective subpixels. In detail, the black matrix layer 115 may serve to shield a portion where the pixel electrode is not formed and a reverse slope formed around the pixel electrode.

In addition, the black matrix layer 115 may block direct light irradiation of the transistor 111 to prevent the leakage current of the transistor 111 from being increased. The black matrix layer 115 may be made of, for example, an inorganic material such as chromium but the material of the black matrix layer 115 is not limited thereto, and therefore may be made of an organic material or other inorganic materials.

In addition, a glass layer 116 for supporting the light conversion layers 114-1, 114-2, and 114-3 and the black matrix layer 115 may be provided over the light conversion layers 114-1, 114-2, and 114-3 and the black matrix layer 115.

The glass layer (or protective layer) 116 may protect the light conversion layer 114 from oxygen, moisture, and the like. The glass layer 116 is only an example, and polyimide, PET, or the like may also be used. In some cases, various sensors such as a touch sensor and an illumination sensor may be provided on the glass layer 116.

A black sealant may be used as a sealant for bonding the glass layer 116 and the light conversion layer 114. The black sealant is bonded in response to ultraviolet light (UV) and bonds between the glass layer 116 and the light conversion layer 114. In some cases, the black sealant may be used for the bonding of the black matrix layer 115 or the black matrix layer 115 itself may be implemented as the black sealant.

An upper substrate (or an upper panel) including the light conversion layer 114, the black matrix layer 115, and the glass layer 116 may be separately formed from a lower substrate (or a lower panel) as illustrated in FIG. 3 and then integrated (or bonded) with the lower substrate as illustrated in FIG. 3.

For example, the upper substrate may be manufactured in the form in which the black matrix layer 115 and the glass layer 116 are laminated on the glass layer 116. Thereafter, the upper substrate including the light conversion layer 114, the black matrix layer 115, and the glass layer 116 is integrated (or bonded) with the lower substrate as illustrated in FIG. 3 using the spacer to maintain the preset spacing.

Figure 4B:
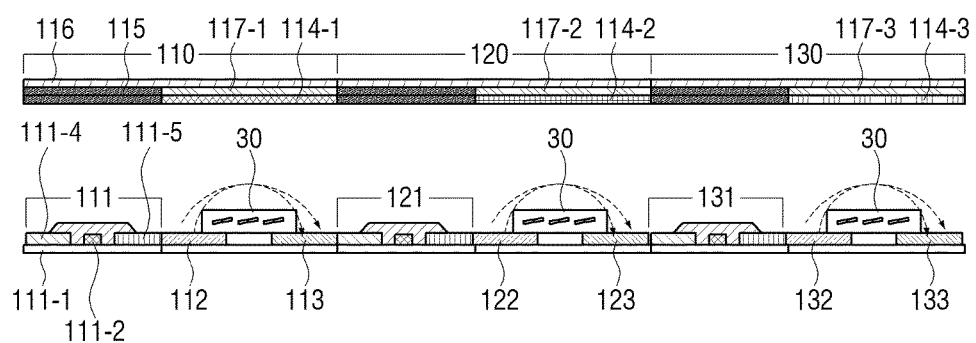

FIG. 4B is a diagram illustrating an LED panel structure in which a color filter is added in the panel structure illustrated in FIG. 4A.

As illustrated, color filter layers 117-1, 117-2, and 117-3 corresponding to the respective subpixels are provided in the corresponding areas of the upper part of the light conversion layers 114-1, 114-2, and 114-3 and the black matrix layer 115 may overlappingly be provided in the corresponding area of the upper part of the black matrix layer 115.

That is, referring to FIG. 4B, the upper substrate may be manufactured in the form in which the black matrix layer 115 and the color filter layers 117-1, 117-2, and 117-3 are laminated on the glass layer 116 and the light conversion layer 114 is laminated on the color filter layers 117-1, 117-2, and 117-3. In this case, the black matrix layer 115 may be formed by the combined height of the color filter layers 117-1, 117-2, and 117-3 and the light conversion layers 114-1, 114-2, and 114-3.

For example, a black matrix pattern may be formed on the glass layer 116, and the light conversion layer 114 may be formed between the black matrix patterns, that is, the black matrix layers 115. Specifically, the black matrix pattern is formed in the order of deposition→cleaning→PR coating-→exposure→development→etching→delamination, and the light conversion layer 115 may be formed on the black matrix pattern by processes such as exposure and development.

The color filter layers 117-1, 117-2, and 117-3 serve to pass only light having wavelengths corresponding to the respective subpixels at the upper portions of the light conversion layers 114-1, 114-2, and 114-3. That is, the color filter layer 117 serves to absorb the remaining light other than the light to be transmitted.

For example, the color filter layers 117-1, 117-2, and 117-3 corresponding to the R subpixels may be implemented to pass only the light of the red wavelength, and the color filter layers 117-1, 117-2, and 117-3 corresponding to the G subpixels may be implemented to pass only the light of the green wavelength.

However, the B subpixel may not include the light conversion layers 114-1, 114-2, and 114-3. Even in this case, the color filter layer corresponding to the B subpixel may pass only the light of the blue wavelength emitted from the blue LED. In this case, the space corresponding to the light conversion layers 114-1, 114-2, and 114-3 may be empty.

Here, the color filter layers 117-1, 117-2, and 117-3 may be implemented as a narrow band color filter and serve to enhance color purity without optical loss.

When no voltage is applied to the light emitting diode 30, each subpixel may not appear dark black but may appear bright black (for example, gray), due to light incident from the outside and reflected again. In this case, the color filter layers 117-1, 117-2, and 117-3 filter the light incident from the outside and the light reflected again to make each subpixel appear dark black even when no voltage is applied to the light emitting diode 30.

Figure 4C:
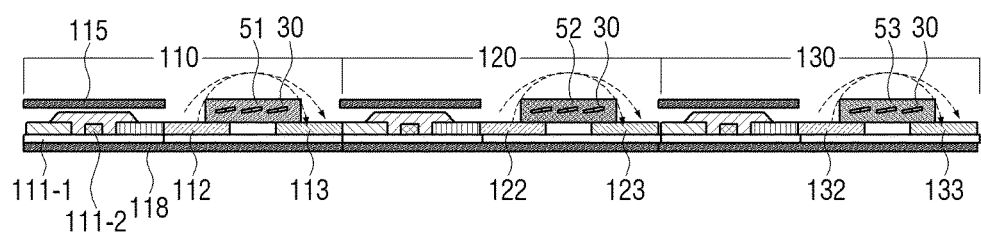

The structure of the LED panel illustrated in FIG. 4C according to another exemplary embodiment may be the form in which the LEDs 30 disposed in the respective subpixel areas 110, 120, and 130 in the structure of FIG. 3 are implemented as the blue LED. When the blue LED passes through the light conversion material, colors visible to human eyes are changed depending on characteristics of the light conversion material. The exemplary embodiment illustrated in FIG. 3 is based on this principle. As illustrated in FIG. 3, the LED 30 may be in a state in which it is coated with light conversion materials 51, 52, and 53.

Here, the light conversion materials 51, 52, and 53 may be light emitting materials that absorb energy to emit red, green, and blue light and may be implemented as the phosphor, the quantum dot, or the like.

The exemplary embodiment illustrated in FIG. 4C and the exemplary embodiment illustrated in FIG. 4A have a difference in that the light conversion layers 114-1, 114-2 and 114-3 are not laminated in the form of the layer like the light conversion layers 114-1, 114-2 and 114-3 illustrated in FIG. 4A but the LED 30 is coated with the light conversion materials 51, 52, and 53 corresponding to the respective subpixels. According to one example, the light conversion materials 51, 52, and 53 may be deposited and coated on a plurality of nano LED by sputtering, plasma enhanced chemical vapor deposition, or the like.

For example, the LED 30 according to an exemplary embodiment may be coated with the plurality of nano LEDs and the light conversion material 51, 52, 53 may not only coat an upper part of the nano LED, but may also be charged between the nano LEDs. For example, the blue LED is coated with the light conversion materials 51, 52, and 53 corresponding to each subpixel to perform the same function as the R, G, B LEDs. In this case, the light conversion material for improving light emitting colors may be coated even in the case of the B subpixel, but the blue LED emits a blue color and therefore the separate light conversion material 53 may not be coated.

The black matrix layer 115 may be formed over the transistor 111. The black matrix layer 115 may be directly deposited (or laminated) over the transistor 111, unlike the exemplary embodiment illustrated in FIG. 4A. The black matrix layer 115 may be manufactured together in a TFT substrate (or TFT panel) process.

A black matrix layer 118 may be further provided under the substrate 111. The additional black matrix layer 118 may serve to represent black when the LED does not emit light.

Figure 4D:
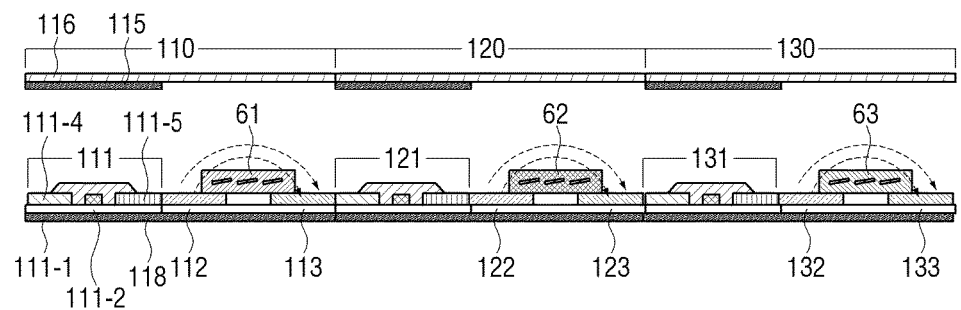

The structure of the LED panel illustrated in FIG. 4D according to another exemplary embodiment may be the form in which LEDs 61, 62, and 63 disposed in the respective subpixel areas 110, 120, and 130 in the structure of FIG. 3 are implemented as a red LED, a green LED, and a blue LED. For example, the LEDs 61, 62, and 62 may be implemented as a nano LED having different diameters to emit different colors, i.e., red, green, and blue.

The structure illustrated in FIG. 4D is similar to the structure illustrated in FIG. 4A, but each of the LEDs 61, 62, and 63 emits the corresponding colors, and therefore does not include the light conversion layers 114-1, 114-2, and 114-3 as illustrated in FIG. 4A.

Accordingly, areas corresponding to the light conversion layers 114-1, 114-2, and 114-3 in the structure illustrated in FIG. 4A are left as an empty space. However, according to another exemplary embodiment, color filter layers as described in FIG. 4B may be provided in the areas corresponding to the light conversion layers 114-1, 114-2, and 114-3.

The remaining structure is similar to the structures illustrated in FIG. 4A or 4B or 4C. For example, color filter layers 117-1, 117-2, and 117-3 as illustrated in FIG. 4B may be further provided over the glass layer 116, or the additional black matrix layer 118 may be further provided under the substrate 111-1 as illustrated FIG. 4C.

Figure 4E:
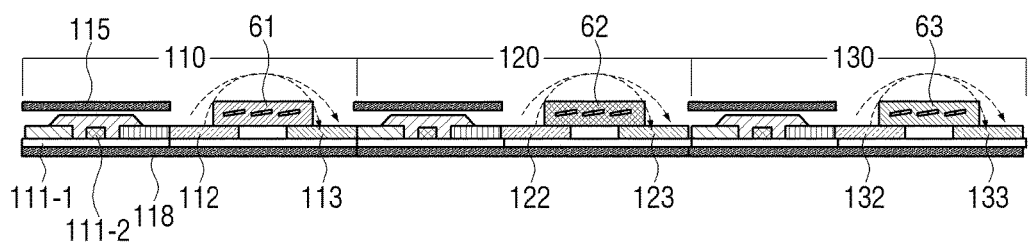

The structure of the LED panel illustrated in FIG. 4E according to another exemplary embodiment may be the form in which LEDs 61, 62, and 63 disposed in the respective subpixel areas 110, 120, and 130 in the structure of FIG. 3 are implemented as a red LED, a green LED, and a blue LED.

The structure illustrated in FIG. 4E is similar to the structure illustrated in FIG. 4C, but each of the LEDs 61, 62, and 63 emits the corresponding colors, and therefore does not include the light conversion materials 51, 52, and 53 as illustrated in FIG. 4C.

The remaining structure is similar to the structures illustrated in FIG. 4A, 4B or 4C. For example, color filter layers 117-1, 117-2, and 117-3 as illustrated in FIG. 4B may be further provided over the glass layer 116, or the additional black matrix layer 118 may be further provided under the substrate 111-1 as illustrated FIG. 4C.

Figure 5:
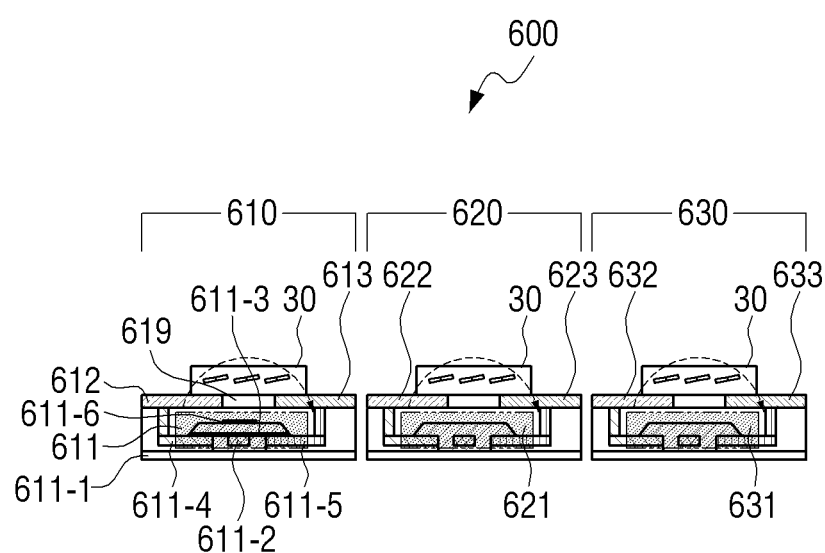
FIG. 5 is a block diagram illustrating a structure of an LED panel according to another exemplary embodiment.

FIG. 5 is a block diagram for describing a basic structure of an LED panel according to another exemplary embodiment.

Referring to FIG. 5, according to another exemplary embodiment, one pixel area 600 of the LED panel may include a substrate 611-1 and a plurality of subpixel areas 610, 620, and 630 formed on the substrate 611-1. Here, the substrate 611-1 may be a substrate 111-1 included in the TFT substrate (or the TFT panel) of FIG. 2.

Transistors 611, 621 and 631 are each provided in a plurality of subpixel electrodes 610, 620, and 630, respectively and a plurality of pixel electrodes 612, 613, 622, 623, 632 and 633 are provided over the transistor 611, 621 and 631, respectively. That is, compared to the foregoing exemplary embodiments illustrated in FIG. 3, the transistors 611, 621 and 631 and the pixel electrodes 612, 613, 622, 623, 632 and 633 are formed on different planes. As such, a surface area of the LED becomes wider as compared with the case where the transistors 111, 121 and 131 and the pixel electrodes 112, 113, 122, 123, 132, 133 are formed on the same plane. However, areas of each subpixel area 610, 620, and 630 may be the same as the areas of each of the subpixel areas 110, 120, and 130 illustrated in FIG. 3.

Moreover, the transistor 611 may include a gate electrode 611-2 formed on a substrate 611-1 (for example, glass, polyimide) and may serve to control a current of an active layer 611-6 to flow or not to flow and a gate insulating film 611-3 serves to separate the gate electrode 611-2 and the active layer 611-6. Further, a source electrode 611-4 and a drain electrode 611-5 serve as a data electrode that serves to supply and receive electron.

An insulating layer 619 may be provided between the transistor 611 and the LED 30. The insulating layer 619 may be made of Polyimide, SiNx, or the like.

Light emitting diodes (LEDs) are placed on the plurality of pixel electrodes 612 and 613 to form pixels, and power is supplied to at least one of the plurality of pixel electrodes 612 and 613 so that the LEDs emit light.

Here, the plurality of pixel electrodes 612 and 613 may include one power supply electrode and one common electrode, or may include two power supply electrodes. In this case, the surface area of the LED is wide, which is advantageous to implement high resolution.

FIGS. 6A to 6D are diagrams illustrating a structure of an LED panel according to another exemplary embodiment.

Figure 6A:
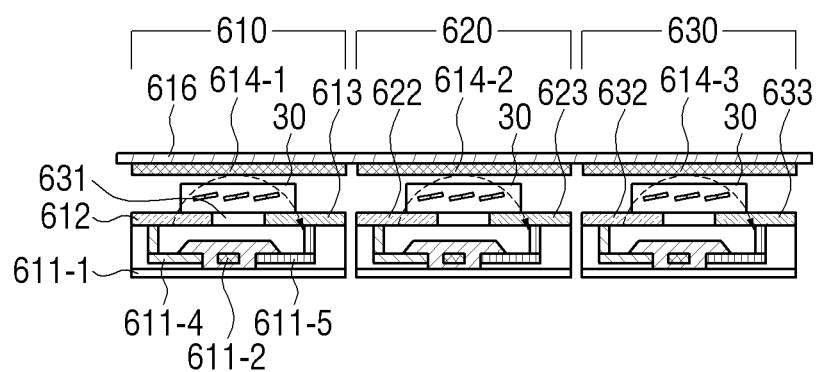
FIGS. 6A to 6D are diagrams illustrating f a structure of an LED panel according to various exemplary embodiment.

In the structure of the LED panel illustrated in FIG. 6A, the LED 30 disposed in each of the subpixel areas 610, 620 and 630 may be implemented as the same type of LED emitting the same color.

In this case, light conversion layers 614-1, 614-2, and 614-3 corresponding to the respective subpixels, that is, the R, G, and B subpixels may be provided over the LED 30 to correspond to the light emitting areas.

A glass layer 616 is provided over the light conversion layers 614-1, 614-2, and 614-3 to protect the light conversion layers 614-1, 614-2, and 614-3 from oxygen, moisture, or the like. Other structures are similar to the structure illustrated in FIG. 4A. In some cases, as illustrated in FIG. 6A, a color filter layer may be provided between the light conversion layers 614-1, 614-2, and 614-3 and the glass layer 616.

Figure 6B:
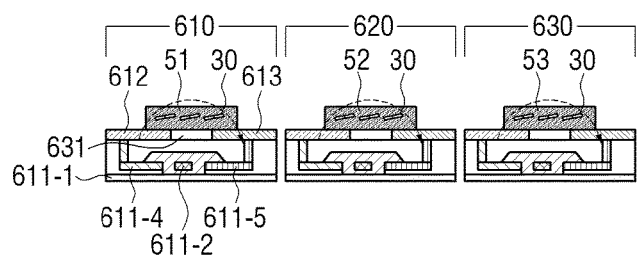

The exemplary embodiment illustrated in FIG. 6B and the exemplary embodiment illustrated in FIG. 6A have a difference in that the light conversion layers 614-1, 614-2, and 614-3 are not laminated in the form of the layer as illustrated in FIG. 6A, but the LED 30 is coated with the light conversion materials 51, 52, and 53 corresponding to the respective subpixels. According to one example, the light conversion materials 51, 52, and 53 may be deposited and coated on a plurality of nano LED by sputtering, plasma enhanced chemical vapor deposition, or the like.

Figure 6C:
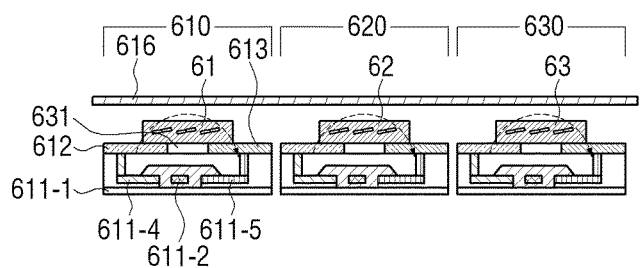

The exemplary embodiment illustrated in FIG. 6C is similar to the structure illustrated in FIG. 6A, but the LEDs 61, 62, and 63 disposed in each of the subpixel areas 610, 620, and 630 may be implemented as the red LED, the green LED, and the blue LED.

In this case, each of the LEDs 61, 62, and 63 emits colors corresponding to each subpixel, and therefore does not include the light conversion layers 614-1, 614-2, and 614-3 as illustrated in FIG. 6A.

Accordingly, areas corresponding to the light conversion layers 614-1, 614-2, and 614-3 in the structure illustrated in FIG. 6A are left as an empty space. However, according to another exemplary embodiment, the color filter layers as described in FIG. 4B may be provided in the areas corresponding to the light conversion layers 614-1, 614-2, and 614-3. Further, as illustrated in FIG. 6A, an additional black matrix layer may be further provided under the substrate 611-1.

Figure 6D:
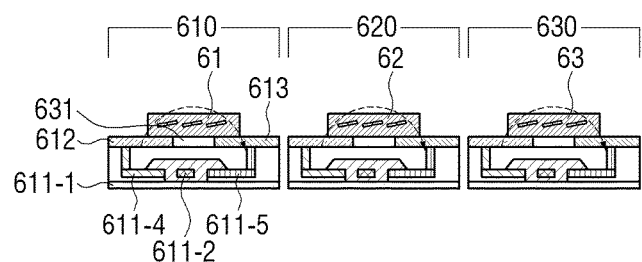

The exemplary embodiment illustrated in FIG. 6D illustrates a structure without a glass layer 616 in the exemplary embodiment illustrated in FIG. 6C.

Figure 7A:
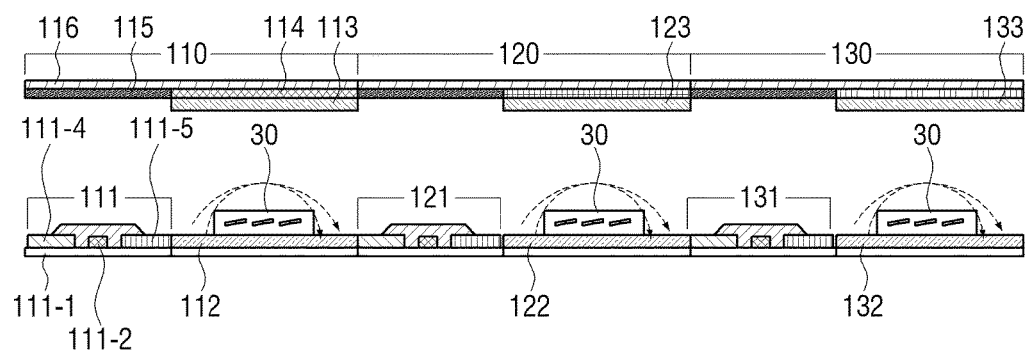
FIGS. 7A and 7B are diagrams illustrating a structure of an LED panel according to another exemplary embodiment.
Figure 7B:
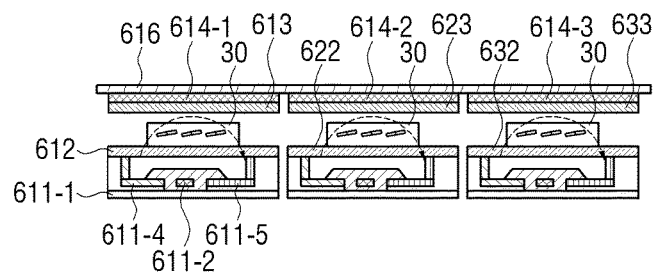

FIGS. 7A and 7B are diagrams for describing a structure of an LED panel according to another exemplary embodiment.

In FIGS. 7A and 7B, the plurality of pixel electrodes 112 and 113 (or 612 and 613) may be provided to face each other in an up and down direction.

That is, as illustrated, the first electrodes 112 and 612 may be formed under the LEDs 30 and the second electrodes 113 and 613 may be formed over the LEDs 30.

FIGS. 7A and 7B illustrate the case in which a plurality of pixel electrodes are provided in the up and down direction similar to the exemplary embodiment illustrated in FIG. 6A.

Figure 8A:
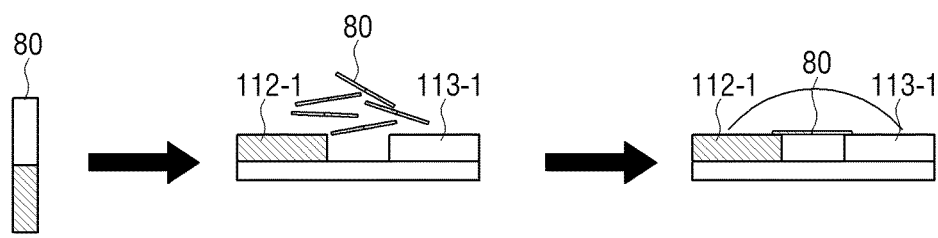
FIGS. 8A to 8C are diagrams illustrating an LED structure and a light emitting principle according to an exemplary embodiment.
Figure 8B:
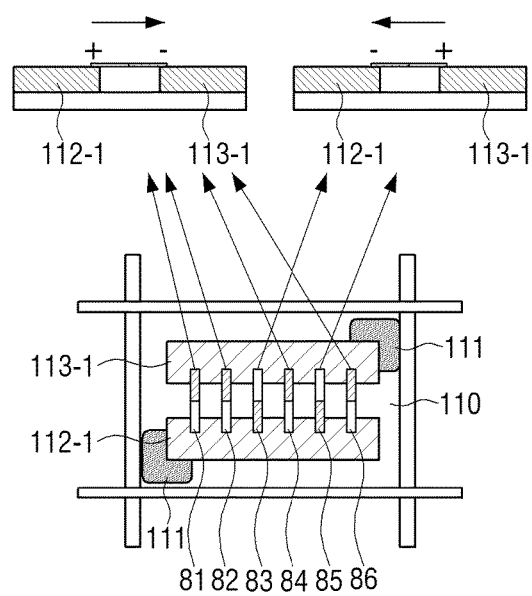
Figure 8C:
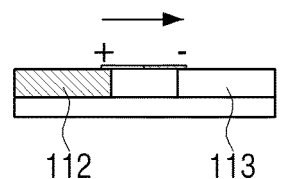
Figure 8C:
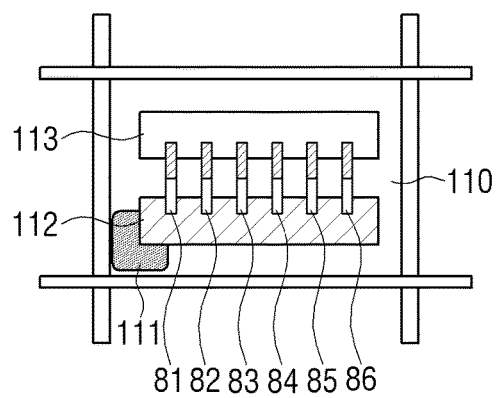

FIGS. 8A to 8C are diagrams illustrating an LED structure and a light emitting principle according to an exemplary embodiment.

As illustrated in FIG. 8A, the LED according to the exemplary embodiment may be implemented as a nano LED 80.

The nano LED 80 may be manufactured by a nano imprint process or a colloidal self-assembly pattern process. In the nano imprint process, various patterns such as lines, dots, and hole patterns may be implemented depending on a shape and a size of a stamp. In the colloidal patterning process, spherical particles may be used, and therefore the pattern shape may be restrictive and the particle size may be adjusted to adjust a size, pattern spacing, or the like.

The nano LED 80 is a light emitting device that converts electrical energy into light energy. In a P-N junction between a P-type semiconductor and an N-type compound semiconductor having different properties, the nano LED 80 recombines electrons with holes to generate light. When a voltage is applied to the nano LED 80, electrons and holes are recombined by meeting a quantum well that is an active layer while moving in opposite directions to each other, thereby emitting excitation energy as photon energy. At this point, a wavelength of light emitted from the nano LED 80 may be determined by a unique energy gap of the active layer and various colors may be implemented by adjusting a composition ratio of the compound semiconductor.

For example, the nano LED 80 may be implemented as a nano rods LED having a small cylindrical structure having a nano size, a nano wire LED having a wire shape, or the like but not limited thereto. For example, a nano rods LED may be a length between tens of μm to hundreds of μm.

The nano LED 80 may have a structure in which a P type and an N type are vertically arranged as a structure in which a P type and an N type are junctioned as described above, but is not limited thereto. For example, the nano LED 80 may have a structure in which the P-type and the N-type may be arranged in a form of a core cell.

As illustrated in FIG. 8A, when the nano LED 80 is implemented as a nano LED having a cylindrical structure, a plurality of nano LEDs 80 are disposed on the plurality of pixel electrodes 112-1 and 113-1 provided in the subpixel area and if a power of tens of volts is applied to the plurality of pixel electrodes 112-1 and 113-1, a field is formed on the plurality of pixel electrodes 112-1 and 113-1 and thus the plurality of nano LEDs 80 are aligned with the electrode depending on the field. When a metallic material is deposited on the plurality of nano LEDs 80 (for example, using the sputtering) aligned as described above, the metal short-circuits between the plurality of nano LEDs 80 and the electrodes. After the LED panel is manufactured by the process, if power is applied to the pixel electrode, the LED panel is operated in the form in which the plurality of nano LEDs 80 emit light.

FIG. 8B illustrates a light emitting principle of the nano LED 80 as illustrated in FIG. 8A when the plurality of pixel electrodes 112-1 and 113-1 are implemented as two power supply electrodes as illustrated in FIG. 1B.

As illustrated in FIG. 8A, the plurality of nano LEDs 80 are placed on the plurality of pixel electrodes 112-1 and 113-1, and a field is formed when power of tens of voltages is applied to the plurality of pixel electrodes 112-1 and 113-1 and thus the plurality of nano LEDs 80 are aligned with the electrodes depending on the field.

However, PN polarities of the plurality of nano LEDs 80 may not be aligned to correspond to each other, and thus as illustrated in FIG. 8B, the p-type semiconductor parts and the n-type semiconductor parts of the plurality of nano LEDs 80 are aligned with each other while having mixed alignment of the PN polarities.

However, as illustrated in FIG. 1B, when the plurality of pixel electrodes 112-1 and 113-1 are implemented as two power source electrodes and the transistors 111 are provided in each pixel electrode, a bi-directional current control is possible.

Accordingly, when power is applied to the first power source electrode 112-1, the nano LEDs 81, 82, 84, and 86 arranged forward to a current flow emit light and when power is applied to the second power supply electrode 113-1, the nano LEDs 83 and 85 arranged forward to the current flow emit light. That is, if power is sequentially quickly applied to the first power supply electrode 112-1 and the second power supply electrode 113-1, all the nano LEDs 81 to 86 disposed in the corresponding pixel area 110 may emit light.

FIG. 8C illustrates the case where the pixel electrodes 112 and 113 are implemented as the power supply electrode 112 and the common electrode 113 and is a diagram for describing a light emitting principle of the nano LED 80 in the case in which one transistor 111 is provided only on the power supply electrode 112 side.

In the electrode structure as illustrated in FIG. 8C, it is required that all the polarities of the plurality of nano LEDs 81 to 86 are arranged to correspond to the electrode structure. That is, as illustrated in FIG. 8C, the p-type semiconductor portions of the plurality of nano LEDs 80 need to be disposed at the power supply electrode 112 side. In this case, when power is applied to the power supply electrode 112, all of the plurality of nano LEDs 81 to 86 are forward arranged to the current flow, and therefore all of the plurality of nano LEDs 81 to 86 emit light.

Figure 9A:
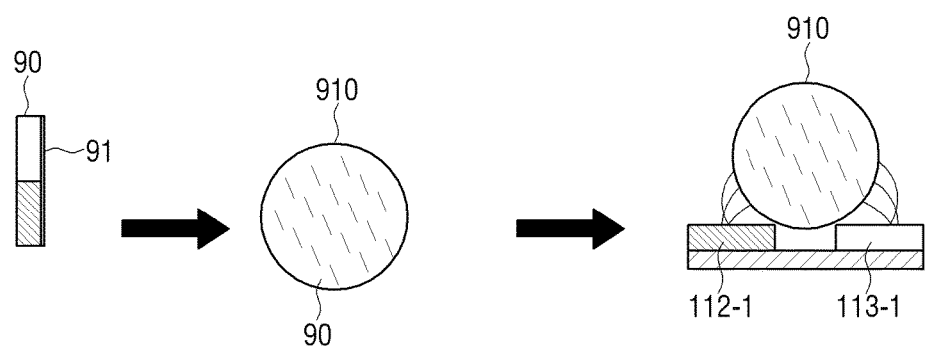
FIGS. 9A and 9B are diagrams illustrating an LED structure and a light emitting principle according to another exemplary embodiment.
Figure 9B:
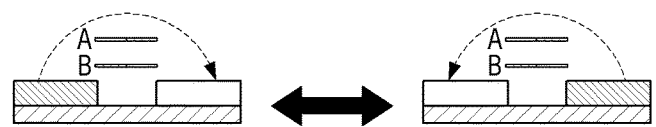

FIGS. 9A and 9B are diagrams for describing an LED structure and a light emitting principle according to another exemplary embodiment.

As illustrated in FIG. 9A, the LED according to another exemplary embodiment is implemented as the nano LED 90 as illustrated in FIG. 8A, but may be the form in which a metallic material 91 (e.g., aluminum) for short-circuiting the PN polarity is deposited in the length direction of the nano LED 90. Here, metal may be aluminum, but is not limited thereto.

In this case, an LED 910 placed on the plurality of electrodes 112-1 and 113-2 disposed in the subpixel area may be a structure in which a plurality of nano LEDs 90 are enclosed with a capsule-shaped transparent insulating film. Here, the transparent insulating film may be implemented to make the capsule-structured LED 910 adhere on the plurality of electrodes 112-1 and 113-1 by an adhesive material.

According to an example, it is also possible to deposit the nano LED capsule 910 on the plurality of pixel electrodes 112-1 and 113-1 using a moisture evaporation deposition method by which deposition is performed as moisture contained in the transparent capsules is evaporated, but the present example is not limited thereto, and therefore various adhesive methods may be used.

The nano LED capsule 910 generates an electromotive force by E-field generated when power is applied to each pixel to emit light.

FIG. 9B is a diagram for describing a light emitting principle of the nano LED capsule 910 having the shape illustrated in FIG. 9A.

Referring to FIG. 9A, the nano LED 90 included in the nano LED capsule 910 does not directly contact the pixel electrode, so that electricity does not conduct through the wiring. Accordingly, the LED may emit light using an electromotive force by an electric field. As illustrated in FIG. 9B, an electric field is generated in the lateral direction. That is, as illustrated in FIG. 3, when the plurality of pixel electrodes 112-1 and 113-1 are apart in the lateral direction, an electric field is generated in the lateral direction.

Specifically, the electromotive force may be generated by a phase difference between electrons and holes (or electron holes or positrons) constituting the nano LED 90. Here, the P/N junction of the nano LEDs for the emission of the nano LEDs is short-circuited using metal, for example Al. That is, the Al attached to the nano LED 90 serves as an antenna to generate the electromotive force.

In this case, the nano LED 90 may react to an external electric field since a closed loop is formed by Al. As the electromotive force is generated by resonance in the inside of the LED in the capsule, the LED emits the light. That is, the LED itself emits the light by the electric field generated when a voltage is applied to the plurality of pixel electrodes 112-1 and 113-1.

Figure 10:
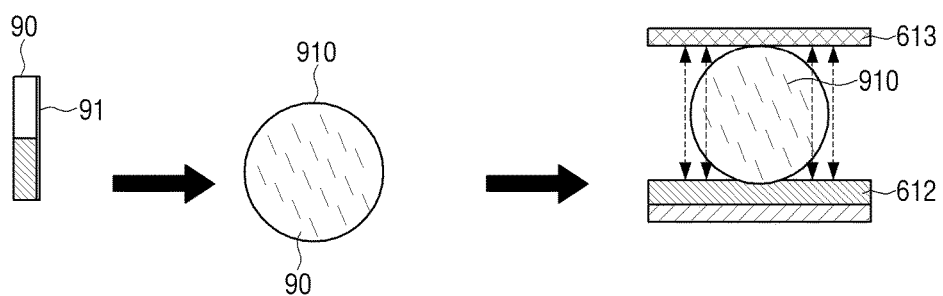
FIG. 10 is a diagram illustrating a light emitting principle of a nano LED capsule according to another exemplary embodiment.

FIG. 10 is a diagram for describing a light emitting principle of the nano LED capsule 910 according to another exemplary embodiment.

Referring to FIG. 10, the electric field is applied in the vertical direction, unlike the electric field applied in the left-right direction in FIG. 9B. That is, as illustrated in FIGS. 7A and 7B, when the plurality of pixel electrodes 112-1 and 113-1 are provided to face each other in an up and down direction, the electric field is applied in the up and down direction.

The principle of generating an electromotive force in the nano LED 90 included in the nano LED capsule 910 to emit light is the same as that illustrated in FIG. 9B, and a detailed description thereof will be omitted.

Hereinafter, a method of manufacturing an LED panel according to an exemplary embodiment will be described.

The terms "deposition", "growth", "lamination", and the like used below have same or similar meaning used for forming a semiconductor material layer and a layer or a thin film formed by various exemplary embodiments may be grown in a growth chamber using metal-organic chemical vapor deposition (MOCVD) or molecular beam epitaxy (MBE) and may be deposited and formed by various methods such as PECVD, APCVD, LPCVD, UHCVD, PVD, an electron beam method, a resistance heating method, or the like.

First, a TFT substrate (or a TFT panel) is manufactured by a TFT process according to an exemplary embodiment.

Figure 11:
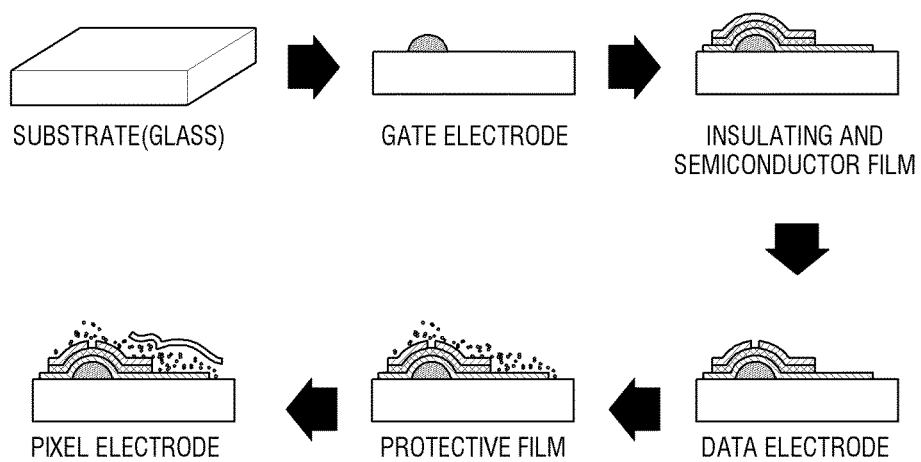
FIG. 11 is a diagram schematically illustrating a process of manufacturing a TFT substrate according to an exemplary embodiment.

FIG. 11 is a diagram schematically illustrating a process of manufacturing a TFT substrate (TFT panel) according to an exemplary embodiment.

As illustrated in FIG. 11, the TFT substrate (or TFT panel) may be manufactured by a TFT process that includes forming the gate electrode on a substrate (for example, glass), forming an insulating film and a semiconductor film on the gate electrode, forming the data electrode, and forming the protective film. However, a plurality of electrodes included in each subpixel area may also be manufactured by the TFT process. As illustrated, the pixel electrode may be manufactured by a final process.

In this case, in the process of depositing a material, the sputtering may be used for a metal material, and the plasma enhanced chemical vapor deposition (PECVD) may be used for a semiconductor or an insulating film. Thereafter, the TFT substrate (or a TFT panel) may be manufactured by coating a photoresist, covering a mask of a desired pattern shape, and then performing an exposure process and a PR delamination process.

Figure 12A:
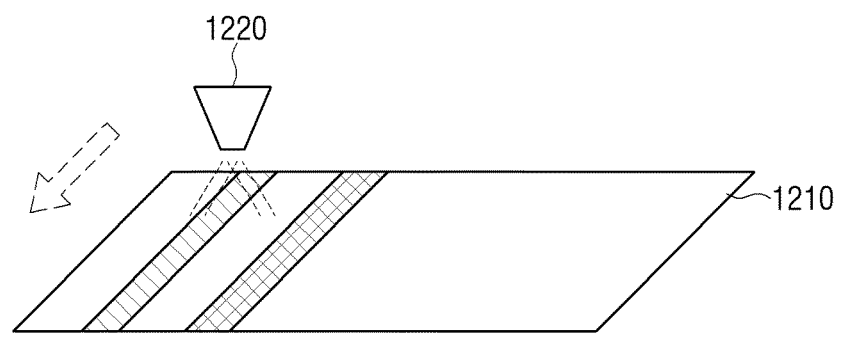
FIGS. 12A to 12C are diagrams illustrating a method for patterning an LED according to an exemplary embodiment.
Figure 12B:
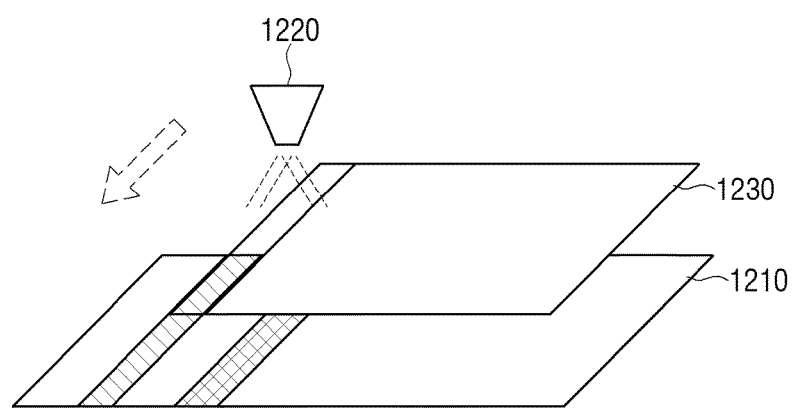
Figure 12C:
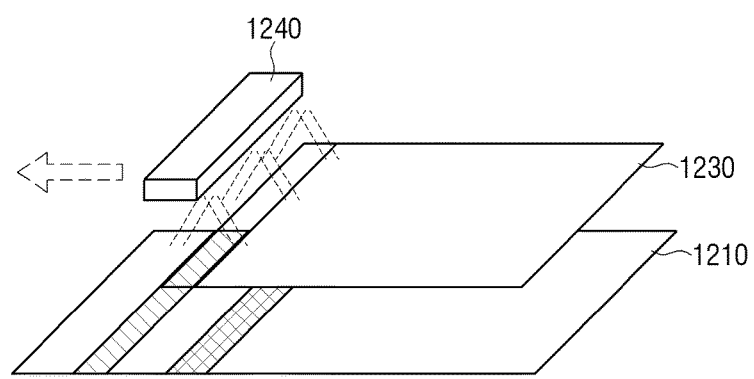

FIGS. 12A and 12C are diagrams for describing a method for patterning an LED according to an exemplary embodiment.

When the TFT substrate (or TFT panel) including a pixel electrode is manufactured by the method illustrated in FIG. 11, the plurality of nano LEDs may be coated on the plurality of pixel electrodes included in each subpixel area to manufacture a lower substrate.

For example, as illustrated in FIG. 12A, the nano LEDs are put in a solvent and a spray 1220 sprays the solvent to the entire surface of a TFT substrate (or TFT panel) 1210, thereby coating the nano LEDs. In this case, the nano LED or the like may be coated on the plurality of pixel electrodes by appropriately adjusting an interval between the TFT substrate (or the TFT panel) and a spray opening.

As another example, as illustrated in FIG. 12B, nano LEDs may be coated on the plurality of pixel electrodes using a mask 1230. For example, the nano LEDs can be coated over the plurality of pixel electrodes using a mask having openings corresponding to the pixel electrode area.

As another example, as illustrated in FIG. 12C, the nano LEDs may be coated using a slit nozzle 1240 and the mask 1230. Alternatively, the nano LEDs may be directly coated only using the slit nozzle 1240. In this case, the width of the slit nozzle 1240 may have a proper width in consideration of the interval between the plurality of pixel electrodes.

By the foregoing method, if the nano LEDs are coated on the plurality of pixel electrodes, an operation of aligning the nano LEDs is performed. For example, when power of tens of volts is applied to the plurality of pixel electrodes as described above, a field may be formed to align the nano LEDs on the plurality of pixel electrodes.

Next, the nano LEDs aligned on the pixel electrode may be attached on the pixel electrode using metal. For example, metal such as Al may be sputtered to attach the nano LEDs on the pixel electrode.

Figure 13:
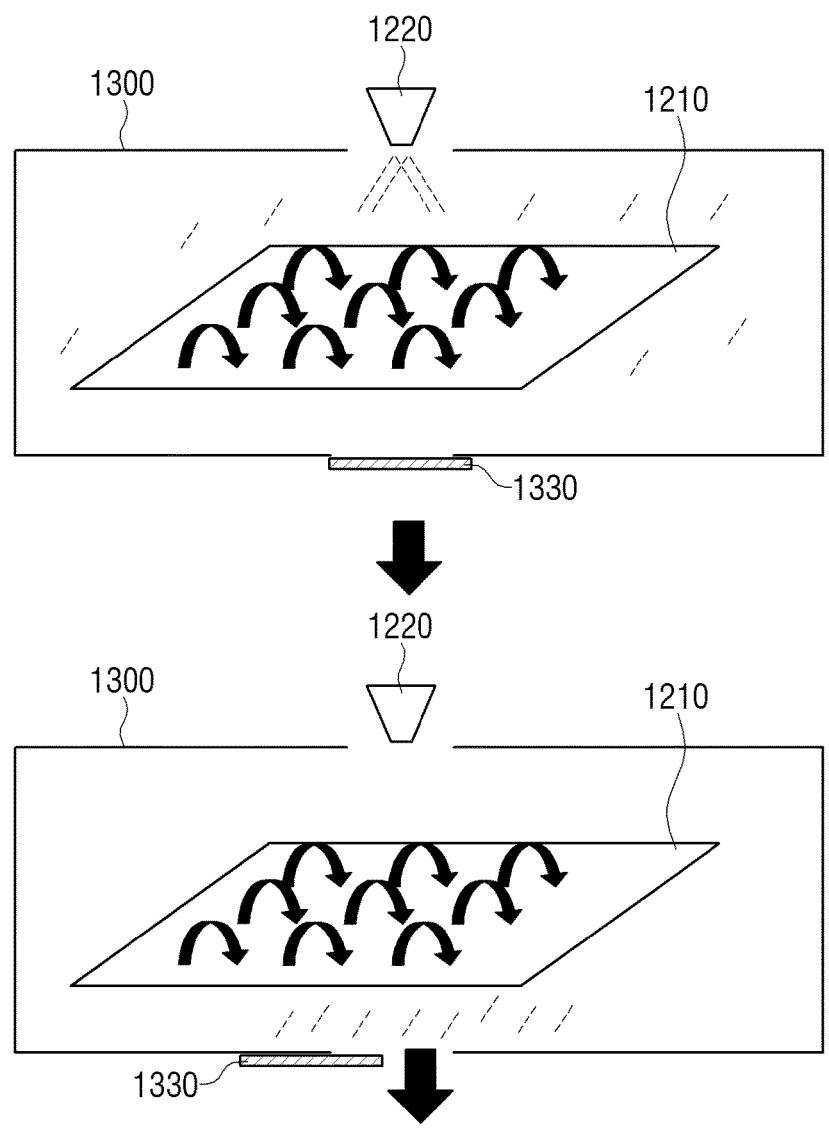
FIG. 13 is a diagram illustrating a method for patterning an LED according to another exemplary embodiment.

FIG. 13 is a diagram for describing a method for patterning an LED according to another exemplary embodiment.

According to FIG. 13, the method for patterning an LED according to an exemplary embodiment may include placing the TFT substrate (or TFT panel) 1210 in a chamber 1300, applying high frequency power to each of the pixel electrodes provided in a pixel area on the TFT substrate 1210, and spraying N2 Gas and nano LED.

In this case, the nano LED is attached to the side to which the electric field is applied depending on the dust collecting effect and is not attached to the side to which the electric field is not applied. That is, the nano LED is attached to the pixel area.

If only the N2 gas is sprayed from the upper nozzle after the coating of the predetermined time and an opening 1310 provided at the lower end is opened, the LEDs not attached due to the electric field are completely discharged due to an air pressure difference, the collected LEDs may be recycled and reused.

Figure 14:
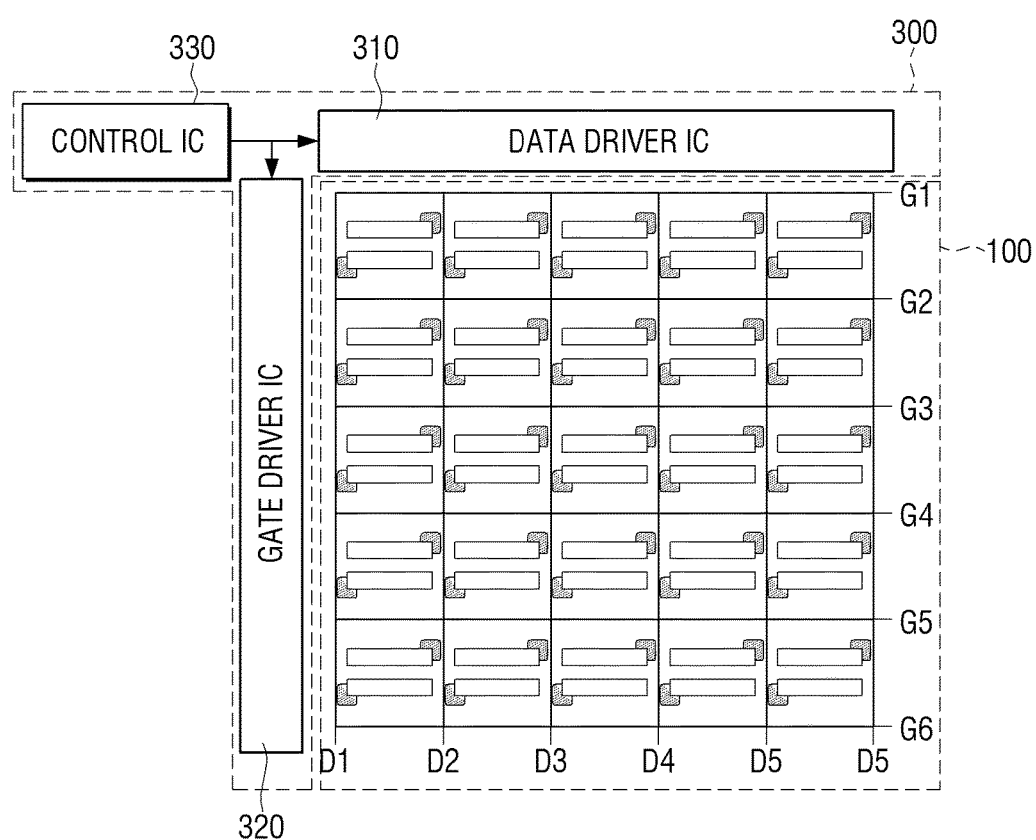
FIG. 14 is a diagram illustrating a circuity for driving an LED panel according to an exemplary embodiment.
Figure 15A:
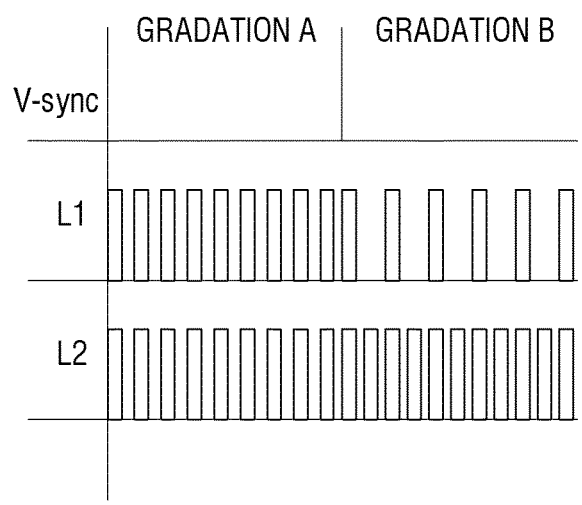
FIGS. 15A and 15B are diagrams illustrating a method for driving an LED panel according to an exemplary embodiment.
Figure 15B:
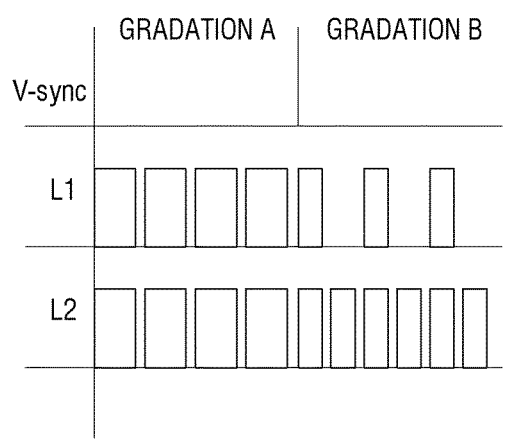

FIGS. 14, 15A and 15B are diagrams for describing a method for driving an LED panel according to an exemplary embodiment.

Referring to FIG. 14, an LED driving module 300 for driving the LED panel 100 includes a data driver IC 310, a gate driver IC 320, and a control IC 330.

The LED panel 100 has a form in which n gate lines G1, G2, G3, ..., Gn formed in a row direction and transmitting gate signals and m data lines D1, D2, D3, ..., Dm in a column direction and transmitting data signals are arranged. However, for convenience of explanation, FIG. 14 illustrates a form in which six gate lines and six data lines are arranged. Each of the plurality of areas defined by gate lines and data lines may be subpixel areas, and the plurality of pixel electrodes, the TFTs, or the like may be provided in each subpixel area. Here, the TFT supplies the data signals from each data line to the pixel electrodes in response to scan pulses from each gate line.

The LED driving module 300 drives the LED panel 100 by supplying a driving current to the LED panel 100 to correspond to a control signal input from a processor. Specifically, the LED driving module 300 adjusts a supply time, a supply strength, and a supply interval of a driving current supplied to the LED panel 100 and outputs the adjusted driving current.

The data driver IC 310 is connected to the data lines D1, D2, D3, ..., Dm and applies the data signal transmitted from the control IC 330 to the LED panel 100.

The gate driver IC 320 generates a gate signal according to a gate control signal transmitted from the control IC 330. The gate driver IC 320 is connected to the gate lines G1, G2, G3, ..., Gn to transmit the gate signals to specific rows of the LED panel 100. The data signal output from the data driver IC 310 is transmitted to the pixel to which the gate signal is transmitted.

The control IC 330 receives an input signal IS, a horizontal synchronization signal Hsync, a vertical synchronization signal Vsync, a main clock signal MCLK, and the like from the processor to generate an image data signal, a gate control signal, a data control signal, an emission control signal, and the like and provide the generated image data signal, gate control signal, data control signal, emission control signal, and the like to the LED panel 100, the data driver IC 310, the gate driver IC 320, and the like.

In particular, the control IC 330 generates a drive signal for driving the LED based on the input signal IS. For example, the control IC 330 may generate a modulated driving signal by a pulse width modulation (PWM) method. The PWM is one of the pulse modulation methods and is a method for performing a modulation by changing a pulse width depending on a magnitude of the modulation signal. For example, when amplitude of a signal wave is large, the pulse width becomes wide and when the amplitude is small, the pulse width becomes narrow.

For example, as illustrated in FIGS. 8A, 8B, 8C, 9A and 9B, in the case of an LED structure in which a current flows by contacting the pixel electrode, various gradations of an image may be represented using a dimming method. That is, brightness of the LED, that is, the gradation of the image may be adjusted by adjusting the pulse width (or frequency width) of the PWM signal (or AC driving signal), that is, a turn-on time.

However, in the case of the capsule-shaped LED structure illustrated in FIG. 10, since a current does not directly flow in the LED, the brightness of the LED may be adjusted by adjusting the frequency of the PWM signal. However, the pulse width of the PWM signal, that is, the turn-on time may also be adjusted.

FIGS. 15A and 15B are diagrams for explaining the driving method in the case where the LED panel is implemented as the nano LED capsule illustrated in FIG. 10.

As FIGS. 15A and 15B, when the LED according to the exemplary embodiment is implemented as a nano LED capsule 910, the brightness of the LED may be adjusted by varying a magnitude of a PWM clock frequency depending on the gradation of the image.

As described above, the nano LED 90 included in the nano LED capsule 910 does not directly contact the pixel electrode, and therefore a current does not flow. Accordingly, the LED may emit light using the electromotive force by the electric field. Specifically, the electromotive force may be generated by a phase difference between electrons and holes (or electron holes or positrons) constituting the nano LED 90. Here, the metal attached to the nano LED 90, for example, Al serves as an antenna to generate the electromotive force.

According to the exemplary embodiment, as illustrated in FIG. 15A, when the gradation of the image is changed from A to B (A>B), the brightness of the LED may be adjusted by varying the size of the PWM clock frequency.

For example, in the case of representing the brightness corresponding to gradation A as illustrated in FIG. 15A, the nano LED capsule 910 corresponding to each pixel line of the pixel area corresponding to the corresponding gradation may be driven by a PWM signal having a frequency of 200 kHz. Here, 200 kHz is a resonance frequency and may be determined based on the size, length, etc., of the nano LED included in the capsule. For example, it may be determined to be an appropriate value by an experiment.

When the gradation of the image displayed in the corresponding pixel area is changed to B, which is lower than A, the brightness of the LED may be adjusted by making frequencies of each pixel line of the pixel area different. For example, when for the nano LED capsule 910 corresponding to a first line, a PWM waveform is generated more densely by increasing 500 kHz, that is, a clock frequency and for the nano LED capsule 910 corresponding to the second line, the PWM waveform is generated more coarsely by lowering 100 KHz, that is, the clock frequency, resonance is generated to reduce the number of LEDs emitting light, thereby reducing brightness. Alternatively, as illustrated in FIG. 15B, when the gradation of the image is changed from A to B (A>B), the brightness of the LED may be adjusted by changing the size and the frequency width of the PWM clock frequency. In this case, the resonance frequencies by gradation for the emission of the LED capsule, that is, the frequency and the frequency width of the PWM clock may be determined on the basis of the size, the length, or the like of the nano LED included in the capsule.

According to various exemplary embodiments as described above, it may be possible to lower the product manufacturing cost by reducing the process complexity occurring in the related art LED package process scheme and removing the LED mounting process.

In addition, it may be possible to improve the efficiency the related art LCD/OLED by providing the method for manufacturing an LED panel.

In addition, there are the method of using the pixel electrode to apply power and the method of using the pixel electrode as an electrode for aligning nano LEDs and thus, a separating/mounting process may be removed. Accordingly, a limitation of high resolution due to a limitation in a minimum interval between parts occurring at the time of mounting may be overcome.

Further, it is described above that the display including R, G, and B subpixels is manufactured. However, the present disclosure is not limited thereto. For example, a monochrome illumination device may be manufactured without using a phosphor.

The methods according to various exemplary embodiments may be programmed and stored in various storage media. Accordingly, the methods according to various exemplary embodiments described above may be implemented in various types of electronic devices for executing a storage medium.

In detail, a non-transitory computer readable medium in which a program sequentially performing the manufacturing method described above is stored may be provided.

The non-transitory computer readable medium is not a medium that stores data therein for a while, such as a register, a cache, a memory, or the like, but means a medium that semi-permanently stores data therein and is readable by a device. In detail, various applications and programs described above may be stored and provided in the non-transitory computer readable medium such as a compact disk (CD), a digital versatile disk (DVD), a hard disk, a Blu-ray disk, a universal serial bus (USB), a memory card, a read only memory (ROM), or the like.

Although exemplary embodiments have been illustrated and described hereinabove, the present disclosure is not limited to the above-mentioned specific exemplary embodiments, but may be variously modified by those skilled in the art to which the present disclosure pertains without departing from the scope and spirit of the disclosure as disclosed in the accompanying claims. These modifications should also be understood to fall within the scope of the present disclosure.

What is claimed is:
1. A light emitting diode (LED) panel comprising:
a substrate; and
a plurality of subpixel areas formed over the substrate,
wherein each of the plurality of subpixel areas comprises:
a plurality of pixel electrodes spaced from each other;
at least one LED formed over the plurality of pixel electrodes; and at least one transistor disposed at one side of at least one of the plurality of pixel electrodes and configured to control at least one of the plurality of pixel electrodes.

2. The LED panel as claimed in claim 1, wherein the at least one transistor is disposed on a same plane as the plurality of pixel electrodes or is disposed below the plurality of pixel electrodes.

3. The LED panel as claimed in claim 2, wherein the at least one LED comprises a blue LED, and
each of the plurality of subpixel areas further comprises:
a light conversion layer formed over the at least one LED and spaced apart from the at least one LED; and
a glass layer supporting the light conversion layer.

4. The LED panel as claimed in claim 3, wherein the light conversion layer comprises at least one of a quantum dot and a phosphor.

5. The LED panel as claimed in claim 3, further comprising:
a cover layer formed over the transistor and covering an area corresponding to the transistor while being spaced apart from the transistor,
wherein the glass layer supports the light conversion layer and the cover layer.

6. The LED panel as claimed in claim 3, further comprising:
a color filter layer laminated over the light conversion layer and having a dimension corresponding to the light conversion layer.

7. The LED panel as claimed in claim 1, wherein the at least one LED comprises a blue LED, and
each of the plurality of subpixel areas further comprises a light conversion material coated on the plurality of pixel electrodes.

8. The LED panel as claimed in claim 1, further comprising a cover layer laminated over the transistor.

9. The LED panel as claimed in claim 1, wherein the at least one LED comprises a red LED, a green LED, and a blue LED, and
each of the plurality of subpixel areas further comprises:
a cover layer formed over the transistor and covering an area corresponding to the transistor while being spaced apart from the transistor; and
a glass layer supporting the cover layer.

10. The LED panel as claimed in claim 1, wherein the at least one LED comprises a red LED, a green LED, and a blue LED, and
each of the plurality of subpixel areas further comprises a cover layer laminated over the transistor.

11. The LED panel as claimed in claim 1, wherein each of the plurality of pixel electrodes are spaced at a predetermined interval, and
the predetermined interval is an interval shorter than a length of a long side of the at least one LED and longer than a length of one polarity of the at least one LED.

12. The LED panel as claimed in claim 1, wherein the at least one LED comprises a plurality of nano LEDs, and
the plurality of nano LEDs are aligned in a longitudinal direction so that different polarities thereof contact the plurality of pixel electrodes, respectively.

13. The LED panel as claimed in claim 12, wherein the at least one LED further comprises a transparent capsule including the plurality of nano LEDs therein.

14. The LED panel as claimed in claim 12, wherein the plurality of nano LEDs included in the transparent capsule are attached with a metallic material in a longitudinal direction.

15. The LED panel as claimed in claim 14, wherein the plurality of nano LEDs included in the transparent capsule are short-circuited by the metallic material, and
the plurality of electrodes emit light as an electromotive force is generated by an electric field generated depending on application of voltage.

16. The LED panel as claimed in claim 15, wherein the plurality of nano LEDs included in the transparent capsule have brightness adjusted on the basis of at least one of a frequency and a pulse width of a pulse width modulation (PWM) signal applied to the plurality of pixel electrodes.

17. A method for manufacturing a light emitting diode (LED) panel, the method comprising:
forming a thin film transistor (TFT) substrate or TFT panel;
dividing the TFT substrate or the TFT panel into a plurality of subpixel areas by a TFT process;
forming a plurality of pixel electrodes spaced apart from each other in at least one of the plurality of subpixel regions; and
forming at least one LED over the plurality of pixel electrodes,
wherein at least one of the plurality of pixel electrodes is formed to be connected to at least one TFT included in the subpixel area.

18. The method as claimed in claim 17, wherein the forming the at least one LED comprises:
coating a plurality of nano LEDs on the plurality of pixel electrodes;
aligning the plurality of nano LEDs in a longitudinal direction by applying a voltage to the plurality of pixel electrodes; and
attaching the plurality of aligned nano LEDs using a metallic material so that different polarities of each of the plurality of nano LEDs contact the plurality of pixel electrodes.

19. The method as claimed in claim 17, wherein the forming the at least one LED comprises attaching a transparent capsule including a plurality of nano LEDs therein to the plurality of pixel electrodes, and
the plurality of nano LEDs included in the transparent capsule are attached with a metallic material in a longitudinal direction.

20. The method as claimed in claim 17, wherein each of the plurality of pixel electrodes are spaced at a predetermined interval, and
the predetermined interval is an interval shorter than a length of a long side of the at least one LED and longer than a length of one polarity of the at least one LED.

* * * * *